United States Patent
Tsai

(10) Patent No.: US 7,508,023 B2
(45) Date of Patent: Mar. 24, 2009

(54) CAPACITOR STRUCTURE AND FABRICATING METHOD THEREOF

(75) Inventor: Mingshang Tsai, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/758,011

(22) Filed: Jun. 5, 2007

(65) Prior Publication Data

US 2007/0230089 A1    Oct. 4, 2007

Related U.S. Application Data

(62) Division of application No. 11/308,237, filed on Mar. 14, 2006, now Pat. No. 7,422,954.

(51) Int. Cl.
*H01L 29/92* (2006.01)

(52) U.S. Cl. .................. 257/303; 257/306; 257/532; 257/E29.343

(58) Field of Classification Search ......... 438/239–240, 438/250, 253, 256, 393, 396, 399; 257/306, 257/532, E29.343, 296, 301, 303; 216/6
See application file for complete search history.

(56) References Cited

U.S. PATENT DOCUMENTS

| | | | |
|---|---|---|---|
| 6,329,234 B1 * | 12/2001 | Ma et al. ................ | 438/210 |
| 6,410,386 B1 * | 6/2002 | Hsue et al. ............. | 438/253 |
| 6,492,226 B1 * | 12/2002 | Hsue et al. ............. | 438/253 |
| 6,500,724 B1 * | 12/2002 | Zurcher et al. ......... | 438/384 |
| 6,583,491 B1 * | 6/2003 | Huang et al. ........... | 257/532 |
| 6,759,703 B1 * | 7/2004 | Matsuhashi ............ | 257/306 |
| 6,916,722 B2 * | 7/2005 | Huang et al. ........... | 438/396 |
| 6,958,509 B2 * | 10/2005 | Korner et al. .......... | 257/306 |
| 7,038,266 B2 * | 5/2006 | Wang ..................... | 257/306 |
| 7,071,054 B2 * | 7/2006 | Park ....................... | 438/243 |
| 7,160,772 B2 * | 1/2007 | Coolbaugh et al. ..... | 438/243 |
| 7,250,334 B2 * | 7/2007 | Crenshaw et al. ...... | 438/239 |
| 2003/0027385 A1 * | 2/2003 | Park et al. .............. | 438/253 |
| 2004/0256654 A1 * | 12/2004 | Korner et al. .......... | 257/306 |
| 2005/0024979 A1 * | 2/2005 | Kim et al. .............. | 365/232 |
| 2006/0223276 A1 * | 10/2006 | Lin et al. ................ | 438/393 |

* cited by examiner

*Primary Examiner*—M. Wilczewski
*Assistant Examiner*—Toniae M Thomas
(74) *Attorney, Agent, or Firm*—Jianq Chyun IP Office

(57) ABSTRACT

A capacitor structure is described, including a substrate, a first metal layer in the substrate, an etching stop layer on the substrate having therein an opening that exposes a portion of the first metal layer, a connection layer on the portion of the first metal layer, the sidewall of the opening and a portion of the etching stop layer, a second metal layer over the connection layer, and an insulating layer between the second metal layer and the connection layer.

6 Claims, 5 Drawing Sheets

CAPACITOR STRUCTURE AND FABRICATING METHOD THEREOF

CROSS-REFERENCE TO RELATED APPLICATION

This application is a divisional of a prior application Ser. No. 11/308,237, filed Mar. 14, 2006, now pending. The entirety of the above-mentioned patent application is hereby incorporated by reference herein and made a part of this specification.

BACKGROUND OF THE INVENTION

1. Field of the Invention

The present invention relates to a structure of an IC device and fabrication of the same. More particularly, the present invention relates to a capacitor structure and a method for fabricating the same.

2. Description of the Related Art

As the integration degree of semiconductor devices is greatly increased, the sizes of the same are much reduced. Since the space for forming capacitors are also much reduced correspondingly, the capacitors have insufficient capacitance. This problem is particularly significant in deep sub-micron processes.

There are three categories of capacitors in general, including metal-insulator-metal (MIM) capacitor, metal-line to metal-line (MOM) capacitor and metal-insulator-silicon (MIS) capacitor. MIM capacitors and MOM capacitors are widely used in deep sub-micron IC products, but adversely have lower unit-area capacitance.

A method to increase the capacitance is to decrease the thickness of the dielectric film between the electrodes, but the uniformity and stability of a thin dielectric film is difficult to control. Another method is to form 3D electrodes with larger surface areas, but the forming process is quite complicated making the mass production difficult. Still another method is to use a high-k material to achieve higher unit-area capacitance, but the reliability of such a capacitor is often insufficient.

FIGS. 1A-1C illustrate, in a cross-sectional view, a process flow of fabricating a capacitor structure in the prior art. Referring to FIG. 1A, a substrate 100 including a capacitor area 101 and a conductive line area 103 is provided, wherein the substrate 100 in the area 103 has been formed with a conductive line 102 therein. Then, a metal layer 104, an insulating layer 106 and another metal layer 108 are sequentially formed over the substrate 100 in the capacitor area 101.

Referring to FIG. 1B, a first patterning step is conducted to remove a portion of each of the metal layer 108 and the insulating layer 106 to form an upper electrode 108a and a patterned insulating layer 106a. A second patterning step is then conducted to remove a portion of the metal layer 104 to form a lower electrode 104a and finish the fabricating process of a capacitor 10.

Referring to FIG. 1C, a dielectric layer 110 is formed over the substrate 100, a third patterning step is conducted to form contact openings 112, 114 and 116, and then metal is filled into the contact openings 112-116 to form contact plugs 112a, 114a and 116a connected with the upper electrode 108a, the lower electrode 104a and the conductive line 102, respectively.

However, because the forming processes of the upper electrode 108a and the lower electrode 104a cannot be integrated with other semiconductor processes, two extra photomasks are needed making the above method complicated and costly.

Moreover, since the contact plugs 112a, 114a and 116a are connected to the upper electrode 108a, the lower electrode 104a and the conductive line 102 respectively, the contact openings 112-116 have different depths. Hence, in the etching stage of the third patterning step, either the deeper contact opening 116 is formed insufficiently deep or the shallower contact openings 112 and 114 overly etched to damage the electrodes.

On the other hand, though the capacitance of such a capacitor 10 can be raised by increasing the lateral areas of the upper electrode 108a, the insulating layer 106a and the lower electrode 104a, the integration degree of devices is reduced by doing so.

SUMMARY OF THE INVENTION

Accordingly, this invention provides a capacitor structure that provides a higher capacitance per unit lateral area.

This invention also provides a method for fabricating a capacitor structure, which is capable of saving one photomask as compared with the prior art.

The capacitor structure of this invention includes a substrate, a first metal layer in the substrate, an etching stop layer, a connection layer, a second metal layer and an insulating layer. The etching stop layer is disposed on the substrate, having therein an opening that exposes a portion of the first metal layer. The connection layer is disposed on the exposed portion of the first metal layer, the sidewall of the opening and a portion of the etching stop layer. The second metal layer is dispose over the connection layer, and the insulating layer is disposed between the second metal layer and the connection layer.

In the above capacitor structure, the etching stop layer may be a silicon oxide (SiO) layer, a silicon nitride (SiN) layer, or a composite layer of a SiO layer and a SiN layer. The material of the connection layer may be titanium (Ti), titanium nitride (TiN), tantalum (Ta), tantalum nitride (TaN) or aluminum (Al). The insulating layer may be a SiO layer, a SiN layer or a silicon oxide/silicon nitride/silicon oxide (ONO) composite layer. The first metal layer may include copper (Cu), and the second metal layer may include Ti, TiN, Ta, TaN or Al.

The method for fabricating a capacitor structure of this invention is described as follows. A substrate having a first metal layer therein is provided, and then an etching stop layer is formed on the substrate. An opening exposing a portion of the first metal layer is formed in the etching stop layer, and then a connection layer is formed on the exposed portion of the first metal layer, the sidewall of the opening and the etching stop layer. An insulating layer is formed on the connection layer, and then a second metal layer is formed on the insulating layer. Thereafter, a portion of each of the second metal layer, the insulating layer and the connection layer outside the opening is removed to form the capacitor structure.

In the above method, removing a portion of each of the second metal layer, the insulating layer and the connection layer outside the opening may include the following steps. A patterned photoresist layer is formed covering the opening and the rest of each of the second metal layer, the insulating layer and the connection layer outside the opening, and then the second metal layer, the insulating layer and the connection layer are etched using the patterned photoresist layer as a mask.

In addition, possible structures/materials of the etching stop layer, the connection layer, the insulating layer, the first metal layer and the second metal layer can be the same as the above-mentioned.

Moreover, after the removal step for the second metal layer, the insulating layer and the connection layer, it is possible to form a dielectric layer over the substrate and then form in the dielectric layer a first contact plug connected with the first metal layer and a second contact plug connected with the second metal layer. In such a case, a protective layer may be formed on the second metal layer and partially removed prior to the removal step for the second metal layer, the insulating layer and the connection layer, so as to protect the second metal layer in the contact opening etching process. The material of the protective layer may be SiN or silicon oxynitride (SiON).

Accordingly, the first metal layer in the substrate and the connection layer, which is disposed on a portion of the first metal layer, the sidewall of the opening and a portion of the etching stop layer, together form a lower electrode of the capacitor. Since the formation of the first metal layer can be integrated with that of a level of interconnect structure and the definition of the opening in the etching stop layer can be integrated with the forming process of alignment marks, only one extra photomask is required in the capacitor fabrication for sequentially defining the second metal layer, the insulating layer and the connection layer. Accordingly, the method of this invention can save one photomask as compared with the prior art.

Moreover, since the connection layer has a portion on the sidewall of the opening, the capacitance of the capacitor can be increased without increasing the lateral area of the same. In addition, since the etching stop layer is formed on the substrate covering the first metal layer, the substrate and the first metal layer are not damaged in the removal step for the second metal layer to the connection layer.

It is to be understood that both the foregoing general description and the following detailed description are exemplary, and are intended to provide further explanation of the invention as claimed.

DESCRIPTION OF THE PREFERRED EMBODIMENTS

Figure 1A:
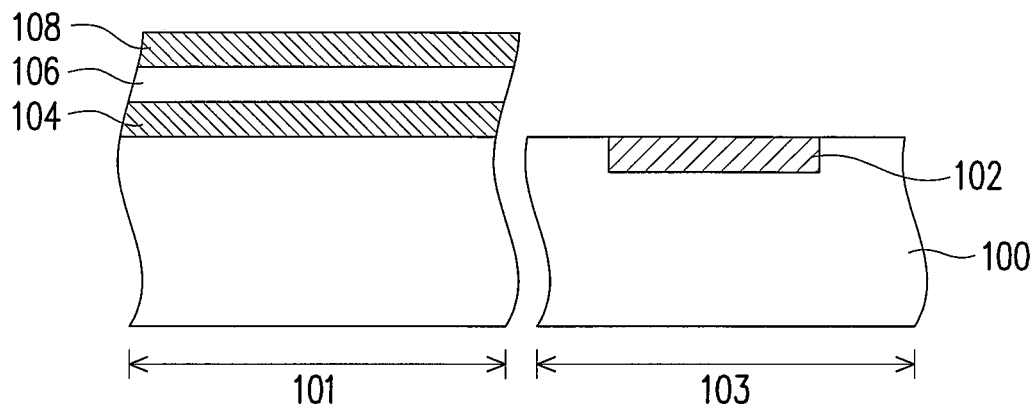
FIGS. 1A-1C illustrate, in a cross-sectional view, a process flow of fabricating a capacitor structure in the prior art.
Figure 1B:
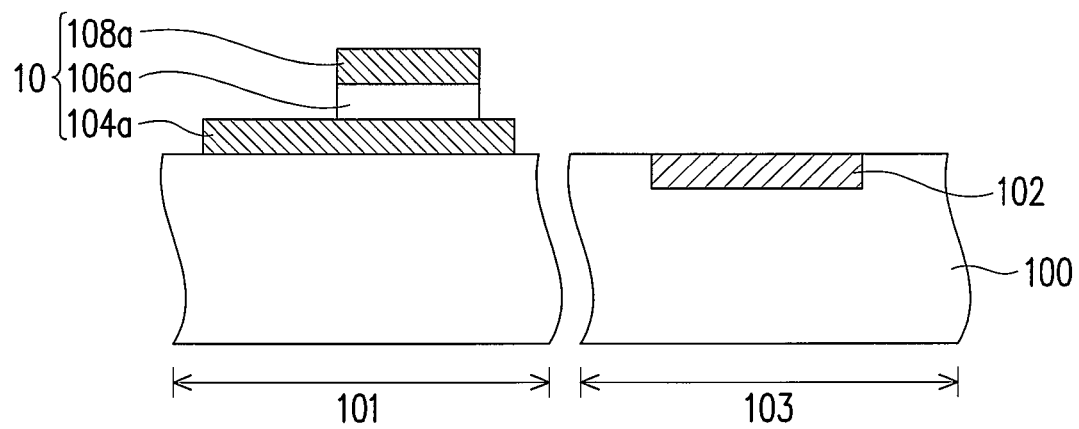
Figure 1C:
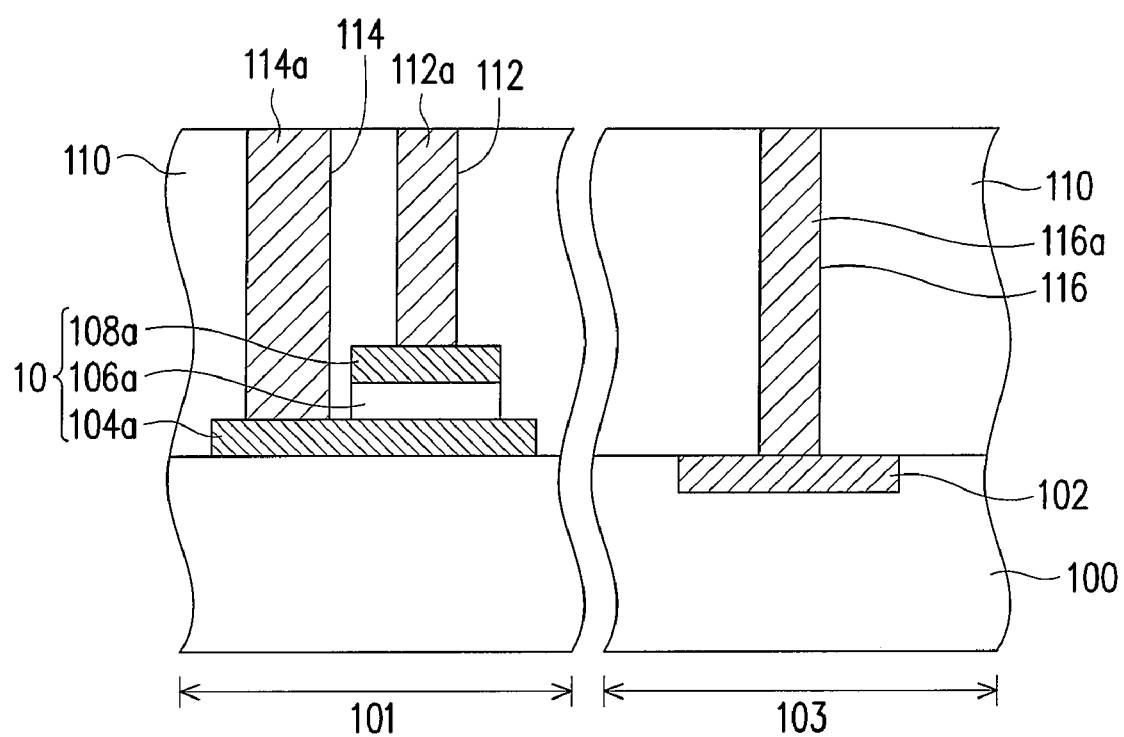
Figure 2A:
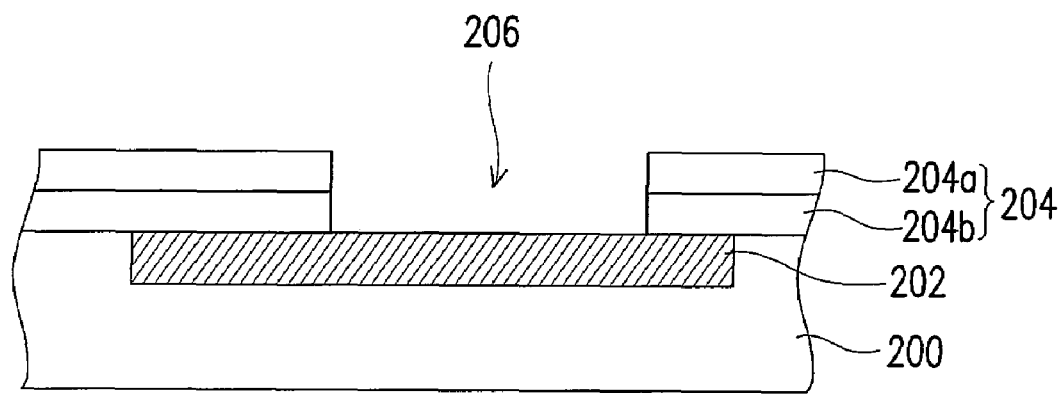
FIGS. 2A-2D illustrate, in a cross-sectional view, a process flow of fabricating a capacitor structure according to an embodiment of this invention.

Referring to FIG. 2A, a substrate 200 is provided, having a metal layer 202 and semiconductor devices (not shown) therein, wherein the metal layer 202 is a part of the lower electrode of the capacitor of this embodiment, as explained later. The material of the metal layer 202 may be copper (Cu). An etching stop layer, such as a composite layer of a SiN layer 204b and a SiO layer 204a thereon, is formed on the substrate 200, possibly through CVD. In other embodiments, the etching stop layer 204 may alternatively be a single SiO or SiN layer. Then, an opening 206 is formed in the etching stop layer 204 exposing a portion of the metal layer 202. The opening 206 may be formed by forming a patterned photoresist layer over the substrate 200 exposing the corresponding portion of the etching stop layer 204, etching the etching stop layer 204 with the photoresist layer as a mask and then removing the photoresist layer. It is particularly noted that the metal layer 202 can be defined simultaneously with a level of interconnect structure and the definition of the opening 206 in the etching stop layer 204 can be integrated with the forming process of alignment marks (not shown), an extra lithography process merely for defining a lower electrode as in the prior art can be saved.

Figure 2B:
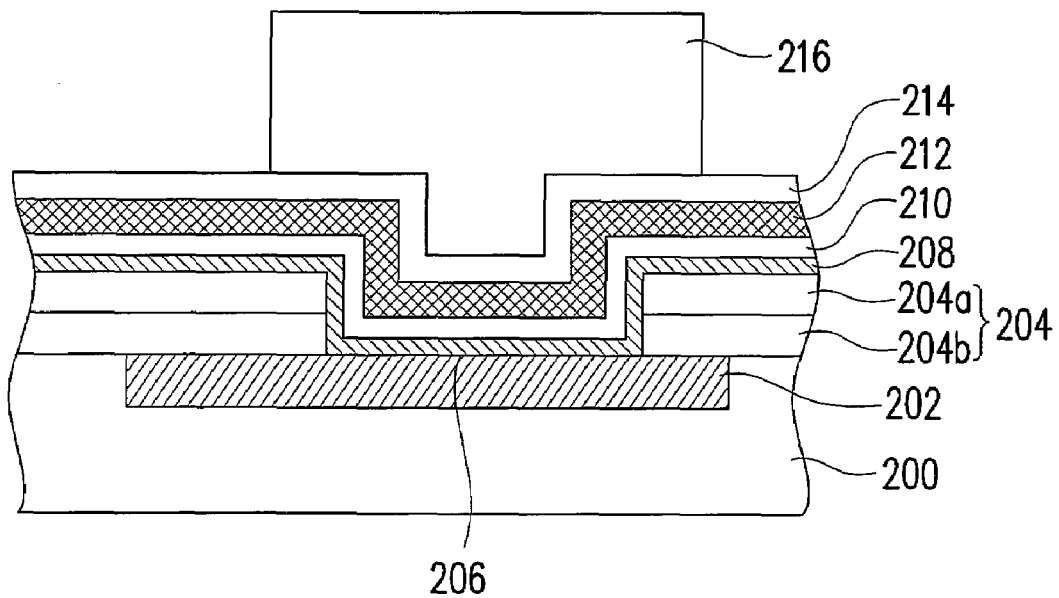

Referring to FIG. 2B, a connection layer 208 is formed on the exposed portion of the metal layer 202, the sidewall of the opening 206 and the etching stop layer 204. The connection layer 208 may include Ti, TiN, Ta, TaN or Al, and may be formed through PVD or CVD. An insulating layer 210 is then formed on the connection layer 208. The insulating layer 210 may include a SiO or SiN layer or an ONO composite layer, and may be formed through CVD. Thereafter, a metal layer 212 is formed on the insulating layer 210, possibly including Ti, TiN, Ta, TaN or Al and formed through PVD or CVD.

Referring to FIG. 2B again, a protective layer 214, possibly including SiN or SiON and formed through CVD, may be formed on the metal layer 212 optionally, so as to protect the metal layer 212 from being damaged in the later contact opening etching process. A patterned photoresist layer 216 is formed over the substrate 200, covering the opening 206 and a portion of each of the metal layer 212, the insulating layer 210 and the connection layer 208 outside the opening 206, i.e., covering the area that is predetermined for forming the upper electrode of the capacitor.

Figure 2C:
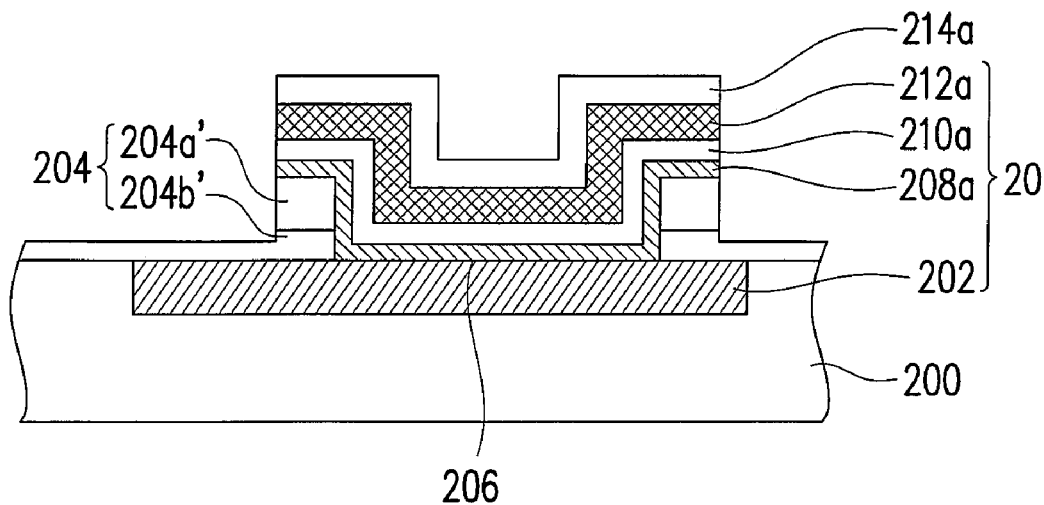

Referring to FIG. 2C, anisotropic etching is done using the patterned photoresist layer 216 as a mask to remove the exposed portion of each of the protective layer 214, the metal layer 212, the insulating layer 210, the connection layer 208 and the SiO layer 204a outside the opening 206 to form an upper electrode 212a, a patterned insulating layer 210a and a patterned connection layer 208a as parts of a capacitor 20 as well as a patterned protective layer 214a and a patterned SiO layer 204a', and then the photoresist layer 216 is removed. The patterned connection layer 208a is connected with the metal layer 202 to form the lower electrode of the capacitor 20 together.

Moreover, in a case where the etching stop layer 204 includes a SiN layer 204b and a SiO layer 204a thereon, the SiN layer 204b has a lower etching selectivity as compared with the SiO layer 204b in the etching process that defines the capacitor 20, so that the etching can be easily controlled to stop on the SiN layer 204b. Thus, the substrate 200 and the metal layer 202 are not damaged.

Figure 2D:
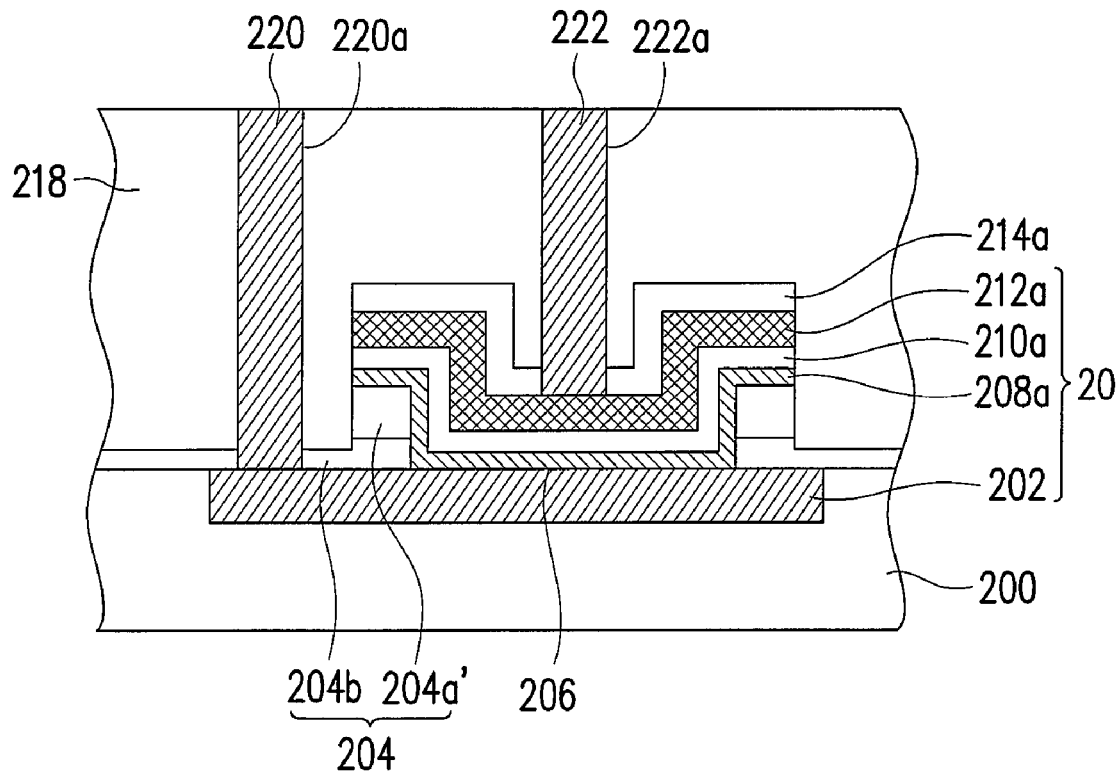

Referring to FIG. 2D, a dielectric layer 218 is formed over the substrate 200 covering the resulting structure. The dielectric layer 218 may include SiO and may be formed through CVD. Contact plugs 220 and 222 are then formed in the dielectric layer 218, connected to the metal layers 202 and the upper electrode 212a, respectively. The contact plugs 220 and 222 may be formed by forming contact openings 220a and 222a in the dielectric layer 218 through anisotropic etching, forming a metal layer over the substrate 200 filling the contact openings 220a and 222a and then removing the metal layer outside the contact openings 220a and 222a through, for example, chemical mechanical polishing (CMP).

It is noted that when a protective layer 214a with a low etching selectivity is formed on the upper electrode 212a, the latter is not damaged in the contact opening etching process even though the etching is continued after the contact opening 222a for the upper electrode 212a is formed to finish the definition of the contact opening 220a for the metal layer 202. Thus, the contact opening etching process is easier to control.

Figure 3:
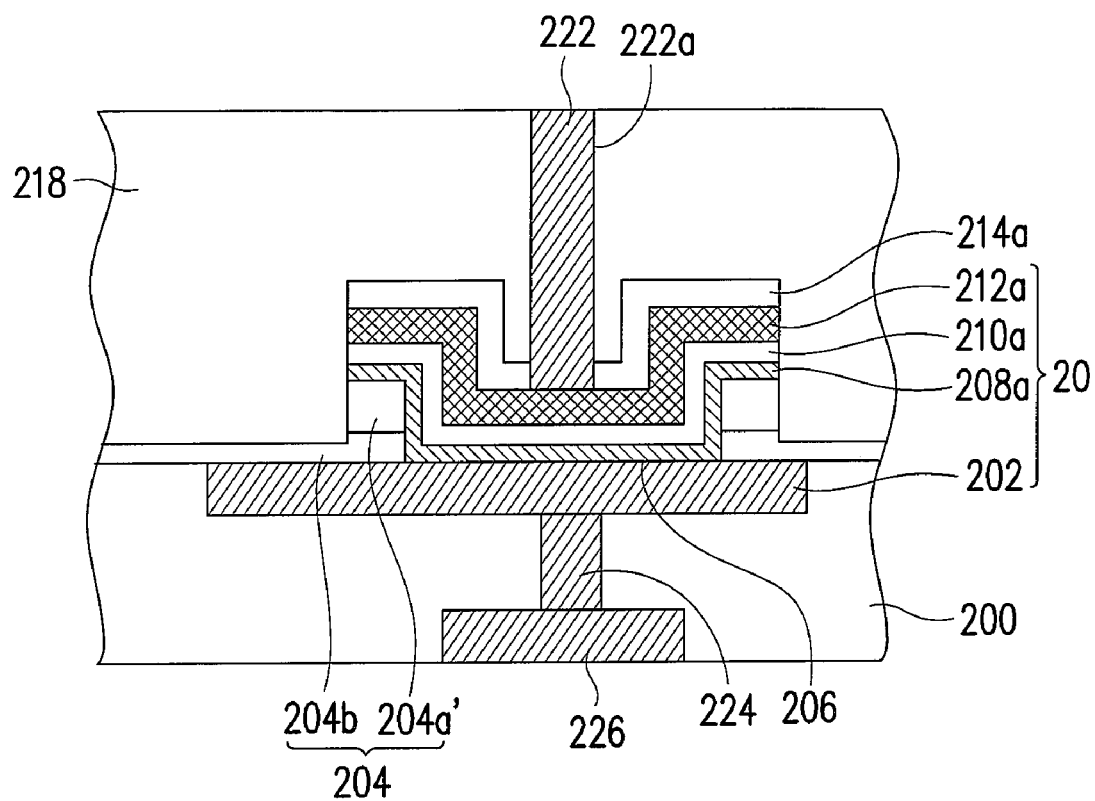
FIG. 3 illustrates a cross-sectional view of a capacitor structure according to another embodiment of this invention.

Besides, in another embodiment where an interconnect structure has previously been formed under the metal layer 202, as shown in FIG. 3, the metal layer 202 can be electrically connected to an underlying conductive line 226 via an underlying contact plug 224. In such a case, no overlying contact plug is required to form for the metal layer 202 in the above contact opening etching process.

The capacitor structure according to the above embodiment of this invention is described below in reference of FIG. 2C. The capacitor structure includes a substrate 200, a metal layer 202, an etching stop layer 204, a connection layer 208a, an upper electrode 212a and an insulating layer 210a. The metal layer 202 is disposed in the substrate 200. The etching stop layer 204 is disposed on the substrate 200, having therein an opening 206 exposing a portion of the metal layer 202. The connection layer 208a is disposed on the exposed portion of the metal layer 202, the sidewall of the opening 206 and a portion of the etching stop layer 204, connected with the metal layer 202 to form a lower electrode. The upper electrode 212a is disposed over the connection layer 208a, and the insulating layer 210a is disposed between the connection layer 208a and the upper electrode 212a. Accordingly, the capacitor 20 includes an upper electrode 212a, an insulating layer 210a and a lower electrode that includes a metal layer 202 and a connection layer 208a.

Since the connection layer 208a includes a portion on the sidewall of the opening 206 that can also provide electrical capacitance, the capacitance per unit lateral area of the capacitor 20 is higher. It is also possible to increase the thickness of the etching stop layer 204, i.e., to increase the height of the sidewall of the opening 206, to further increase the capacitance of the capacitor 20 without increasing the lateral area of the lower and the upper electrodes. In other words, the capacitor structure of this invention allows the capacitance to be increased by increasing the thickness thereof instead of increasing the lateral area thereof. Thus, the capacitance of the capacitor 20 can be increased without decreasing the integration degree.

Moreover, because the formation of the metal layer 202 can be integrated with that of a level of interconnect structure and the definition of the opening 206 in the etching stop layer 204 can be integrated with the forming process of alignment marks, only one extra photomask is required in the above capacitor fabrication for sequentially defining the second metal layer 212, the insulating layer 210 and the connection layer 208. Accordingly, the method of this invention can save one photomask as compared with the prior art.

Furthermore, since the etching stop layer 204 is formed on the substrate 200 covering the metal layer 202 disposed in the substrate 200, the substrate 200 and the metal layer 202 are not damaged in the etching process that defines the capacitor 20.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A capacitor structure, comprising:
   a substrate;
   a first metal layer in the substrate;
   an etching stop layer on the substrate, having therein an opening that exposes a portion of the first metal layer;
   a connection layer on the portion of the first metal layer, a sidewall of the opening and a portion of the etching stop layer;
   a second metal layer over the connection layer;
   an insulating layer between the connection layer and the second metal layer, wherein edges of insulating layer, second metal layer and connection layer are aligned with each other, and a normal line of an alignment surface formed by the aligned edges is perpendicular to a normal line of the substrate;
   a dielectric layer over the substrate to cover the second metal layer;
   a first contact plug in the dielectric layer connected with the first metal layer; and
   a second contact plug in the dielectric layer connected with the second metal layer.

2. The capacitor structure of claim 1, wherein the etching stop layer comprises a SiO layer, a SiN layer, or a composite layer of a SiO layer and a SiN layer.

3. The capacitor structure of claim 1, wherein the connection layer comprises Ti, TiN, Ta, TaN or Al.

4. The capacitor structure of claim 1, wherein the insulating layer comprises a SiO layer, a SiN layer or an ONO composite layer.

5. The capacitor structure of claim 1, wherein the first metal layer comprises Cu.

6. The capacitor structure of claim 1, wherein the second metal layer comprises Ti, TiN, Ta, TaN or Al.

* * * * *